United States Patent [19]

Malocha et al.

[11] Patent Number: 5,028,831
[45] Date of Patent: Jul. 2, 1991

[54] SAW REFLECTIONLESS QUARTER-WAVELENGTH TRANSDUCERS

[75] Inventors: Donald C. Malocha, Longwood, Fla.; David Penunuri, Fountain Hills, Ariz.

[73] Assignee: Motorola, Inc., Schaumburg, Ill.

[21] Appl. No.: 504,506

[22] Filed: Apr. 4, 1990

[51] Int. Cl.$^5$ .............................................. H01L 41/08
[52] U.S. Cl. ........................... 310/313 A; 310/313 B; 310/313 C
[58] Field of Search ........... 310/313 A, 313 B, 313 C, 310/313 D

[56] References Cited

U.S. PATENT DOCUMENTS

| | | | |
|---|---|---|---|
| 4,458,221 | 7/1984 | Suzuki | 310/313 C |
| 4,463,327 | 7/1984 | Suzuki et al. | 310/313 C |
| 4,513,262 | 4/1985 | Schofield et al. | 310/313 C |
| 4,567,453 | 1/1986 | Schofield | 310/313 D |
| 4,575,698 | 3/1986 | Schofield | 310/313 D |
| 4,616,197 | 10/1986 | Wright | 310/313 D |
| 4,731,595 | 3/1988 | Wright | 310/313 D |
| 4,866,325 | 9/1989 | Kodama et al. | 310/313 B |
| 4,870,312 | 9/1989 | LaRosa et al. | 310/313 B |

FOREIGN PATENT DOCUMENTS

| | | | |
|---|---|---|---|
| 0066118 | 5/1980 | Japan | 310/313 C |
| 0123222 | 9/1980 | Japan | 310/313 B |
| 0145214 | 8/1983 | Japan | 310/313 B |

OTHER PUBLICATIONS

"A Directional Surface Wave Transducer", by T. W. Cole, from Monitor-Proceedings of IREE AUST (Australia), Mar. 1978.

Primary Examiner—Mark O. Budd
Assistant Examiner—Thomas M. Dougherty
Attorney, Agent, or Firm—Frank J. Bogacz; Jordan C. Powell

[57] ABSTRACT

A SAW transducer eliminates mechanical energy reflections by using one-quarter wavelength electrodes spaced at predetermined intervals. Dummy electrodes are shifted one-quarter wavelength to cancel energy reflections in the active electrodes. A pair of dummy electrodes is required for each active set of electrodes (the active set comprises one positive and two negative electrodes).

5 Claims, 5 Drawing Sheets

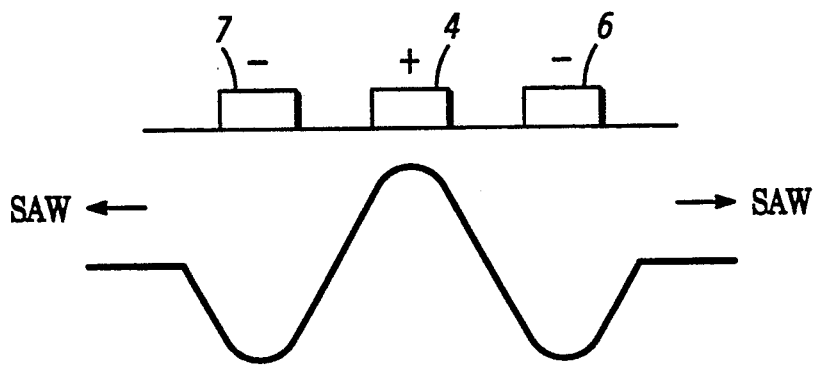
FIG. 1
FIG. 2
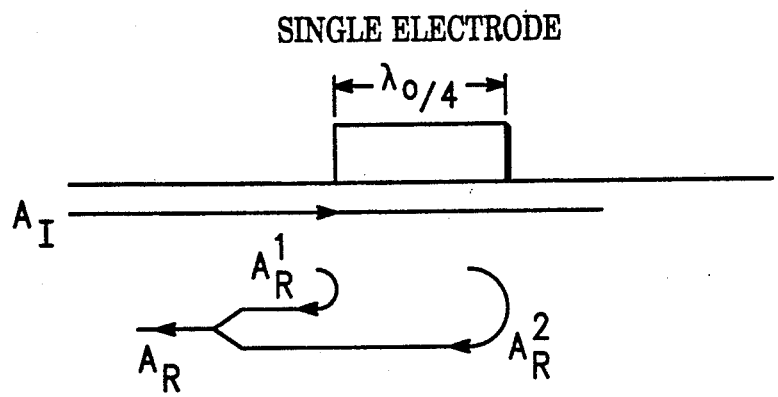
$\lambda_0 f_0 = \nu$
$\lambda_0$ = CENTER FREQUENCY WAVELENGTH
$f_0$ = CENTER FREQUENCY
$\nu$ = ACOUSTIC VELOCITY

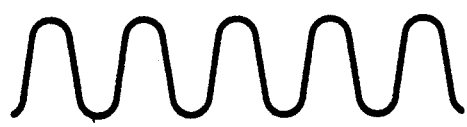
FIG. 3A
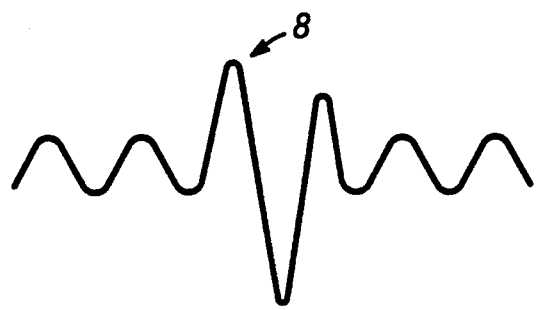
FIG. 3B
FIG. 5
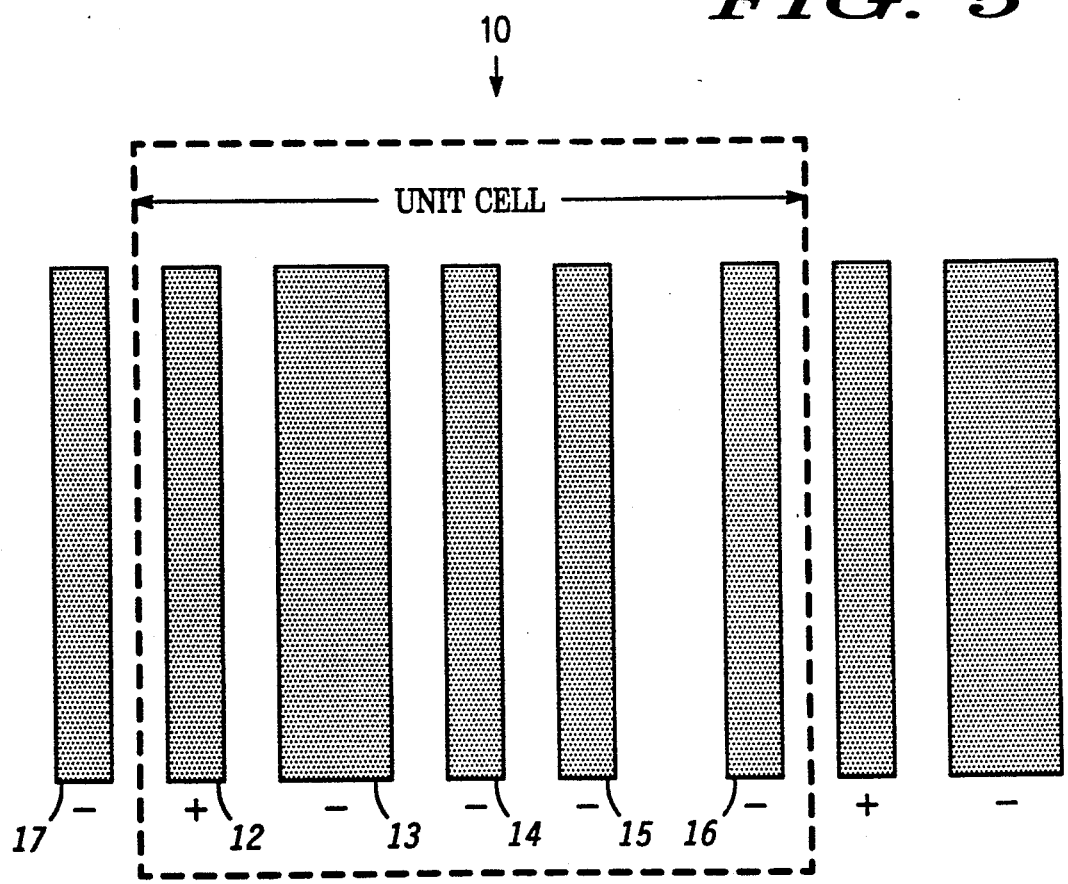

MAIN SAW RESPONSE
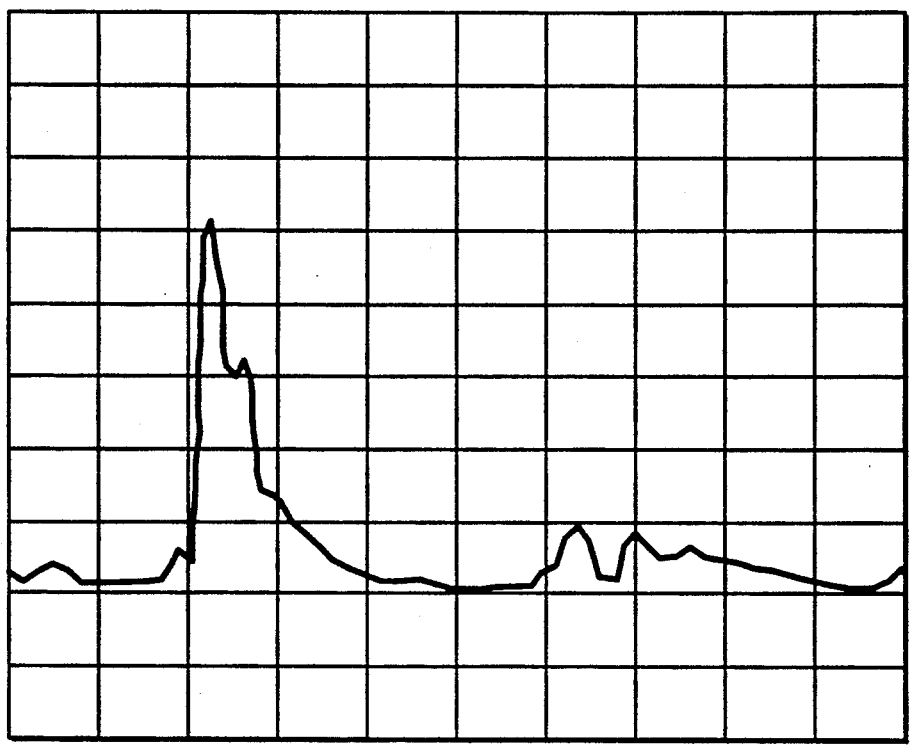
FIG. 4A
FIG. 4B
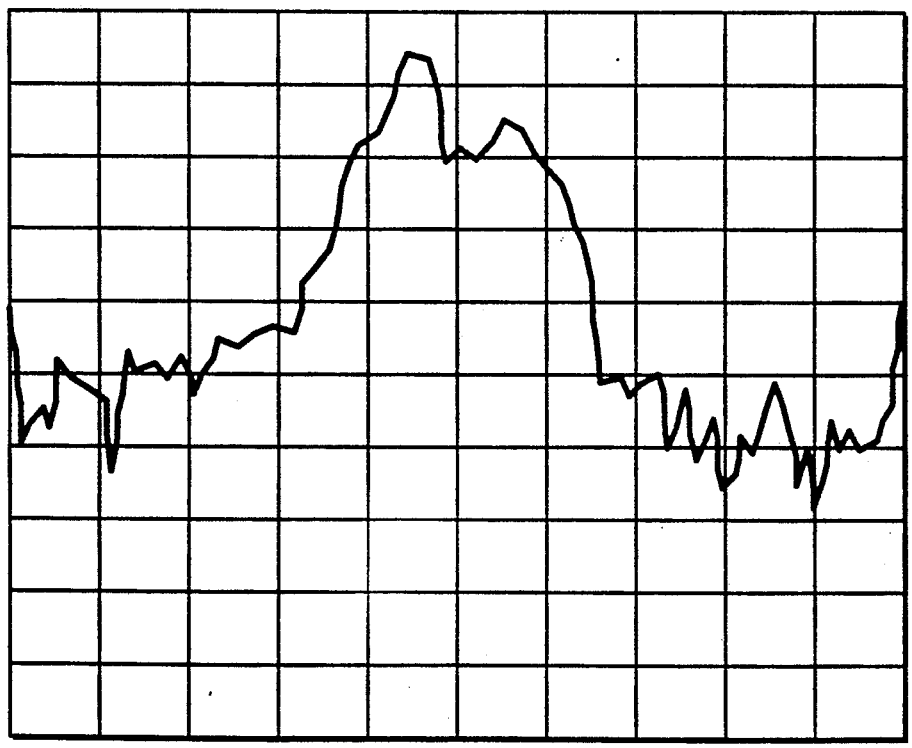

SAW RESPONSE
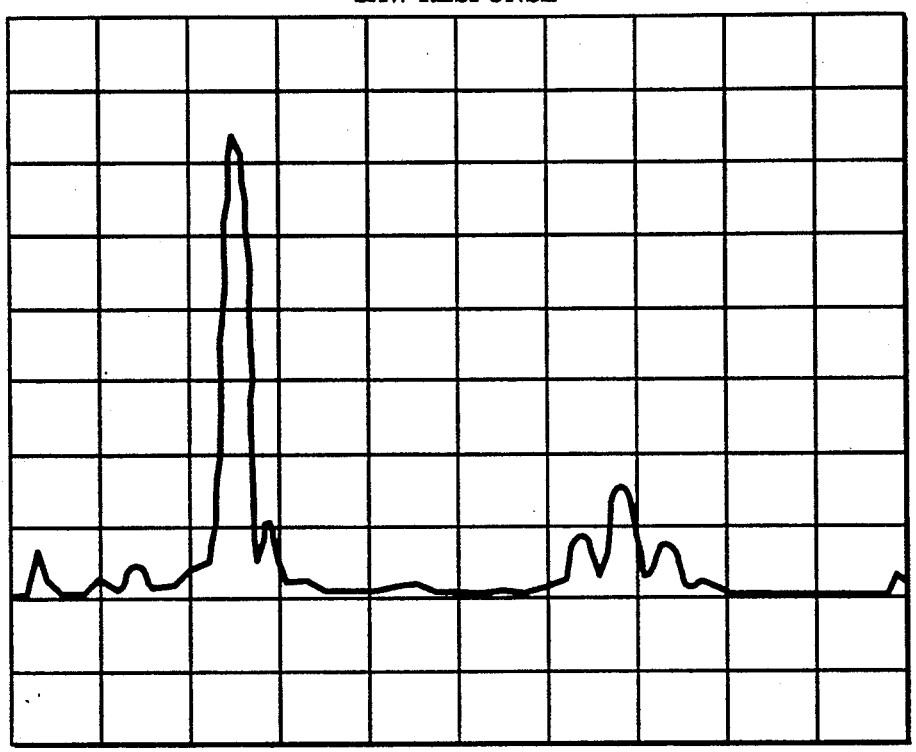
FIG. 7A
FIG. 7B
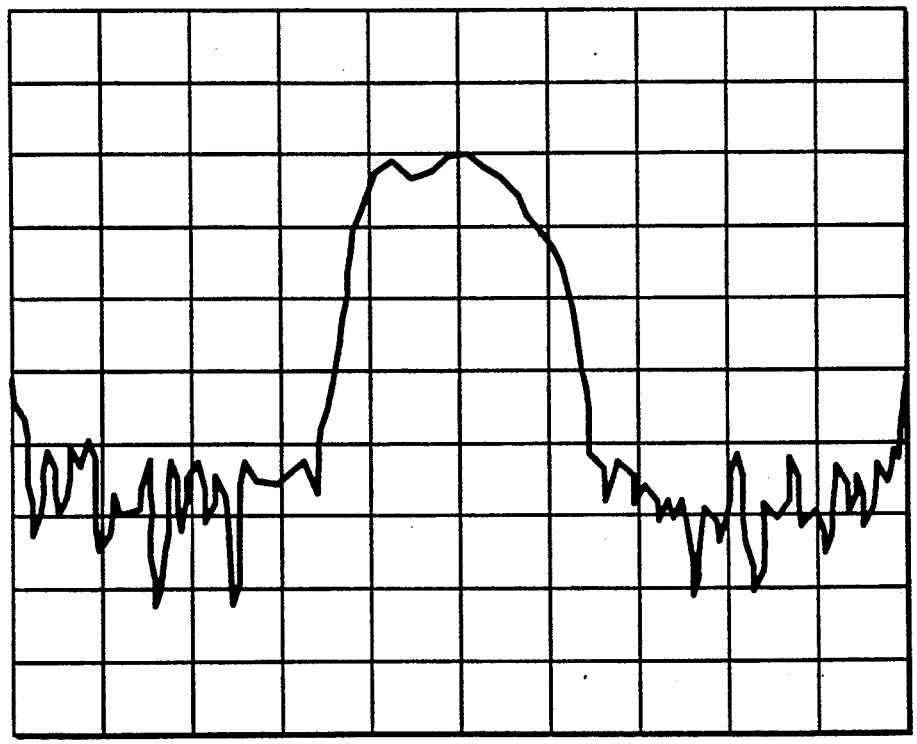

SAW REFLECTIONLESS QUARTER-WAVELENGTH TRANSDUCERS

BACKGROUND OF THE INVENTION

This invention relates, in general, to surface acoustic wave (SAW) devices, and more specifically, to SAW transducers.

SAW devices are increasingly operating at higher frequencies. These higher frequencies demand increasingly higher line resolution in the transducer and filter electrodes.

An optimum width for SAW electrodes is one-quarter (¼) wavelength. This width, however, results in reflections of the generated energy. Specifically, as energy encounters an electrode edge, a reflection results at center frequency. As the energy continues through the electrode and encounters the opposite edge, an additional reflection results. This reflected energy combines with other reflected energy and results in major distortion to the SAW.

Most of the present SAW device electrodes are designed with one-eighth (⅛) or one-sixth (1/6) wavelength widths since these widths eliminate center frequency reflections. Using the smaller wavelength widths decreases the line resolution of the electrodes. Furthermore, the smaller the wavelength, the smaller the electrode must be. For instance, at one GHz, a one-quarter wavelength electrode is approximately 0.9 microns, while a one-eighth wavelength is approximately 0.45 microns. Also, the width of the electrode is inversely proportional to the frequency. The one-quarter wavelength electrode facilitates twice the SAW operating frequency as the one-eighth wavelength electrode geometry for a given line width resolution.

One approach to eliminating quarter wavelength acoustic center frequency reflections is presented in an article entitled "IIDT Type SAW Filter Using Acoustic Reflection Cancel Condition With Solid IDT" by Mishima et al., 1989 IEEE Ultrasonics Symposium, which has not yet been published. This approach has a very specific use and is limited to reflections on 128° LiNbO3 SAW devices used in cellular radio filters.

SUMMARY OF THE INVENTION

Accordingly, it is an object of the present invention to provide a SAW transducer which utilizes one-quarter wavelength electrodes and eliminates energy reflections from the electrode edges.

A SAW transducer eliminates mechanical energy reflections by using one-quarter wavelength electrodes spaced at predetermined intervals. Dummy electrodes are shifted one-quarter wavelength in the direction of energy propagation to cancel energy reflections in the active electrode regions. A pair of dummy electrodes is required for each direction of SAW propagation from each active set of electrodes (the active set comprises one positive and two negative electrodes).

The above and other objects, features, and advantages of the present invention will be better understood from the following detailed description taken in conjunction with the accompanying drawings.

BRIEF DESCRIPTION OF THE DRAWING

FIG. 1 is a schematic describing how a surface acoustic wave (SAW) is generated.

FIG. 2 diagrams how reflections are caused within SAW transducers.

FIG. 3 shows how reflections within a conventional SAW transducer affect a SAW.

FIG. 4 shows SAW response curves for a conventional SAW transducer using quarter wavelength electrodes.

FIG. 5 is a schematic of a unit cell for a SAW transducer according to the present invention.

FIG. 7 show SAW response curves for the transducer of FIG. 6.

DETAILED DESCRIPTION OF THE INVENTION

Figure 6:
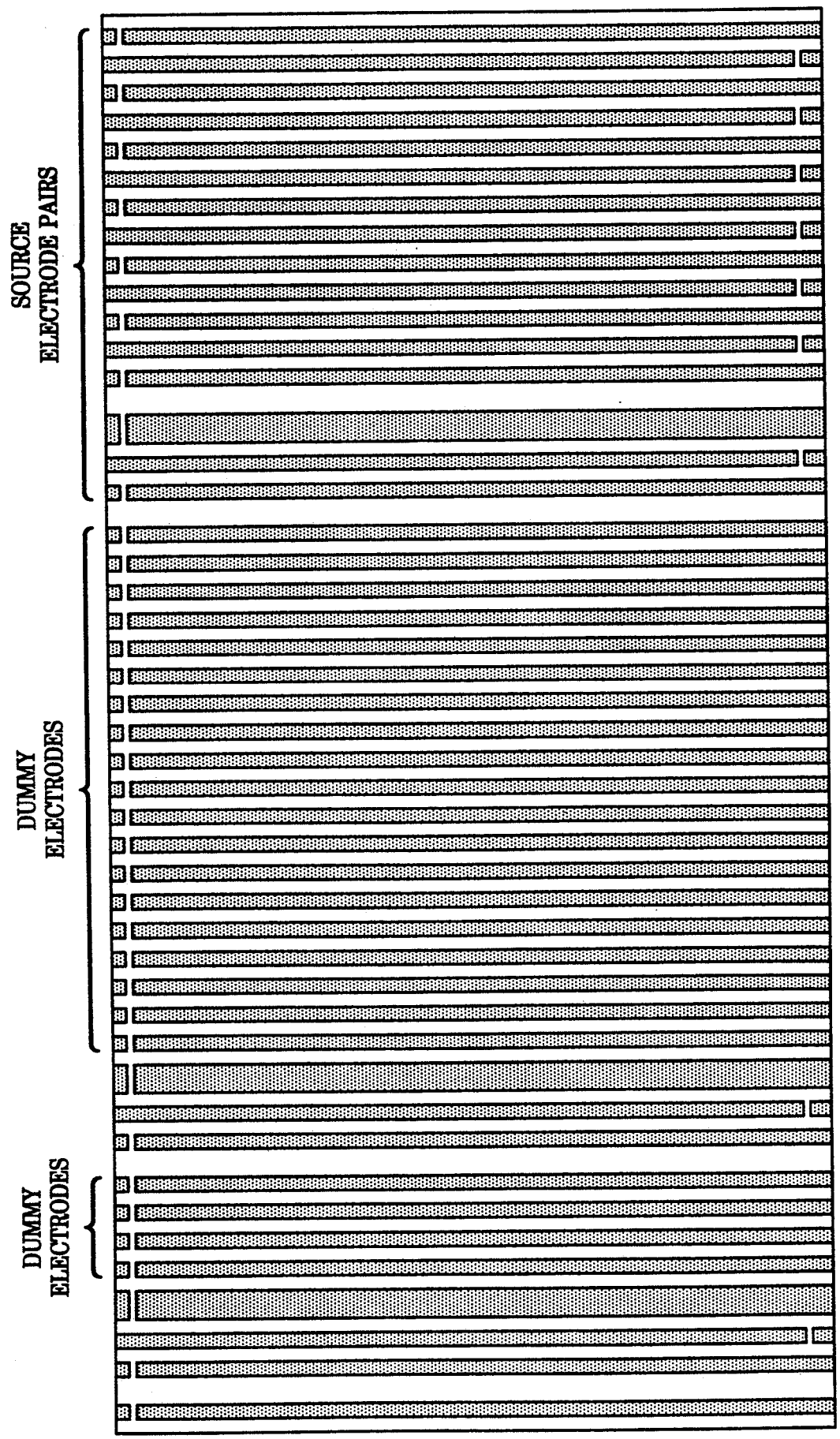
FIG. 6 is a schematic of a SAW transducer according to the present invention.

FIG. 1 shows how a surface acoustic wave (SAW) is generated within a piezoelectric substrate, such as quartz. To generate a typical SAW wave, a positive charge electrode 4 is separated from two negatively charged electrodes 6 and 7 a distance equal to the width of one of the electrodes. Acting as a transducer, the electrodes and the accompanying substrate generate a SAW which propagates in both longitudinal directions.

A single SAW transducer is usually constructed of many positive/negative electrode sets. Therefore, energy within a SAW from one set will inevitably encounter other active sets of electrodes as it propagates through the substrate. FIG. 2 shows the effect on a SAW encountering an additional active electrode. As the energy encounters the edge of the electrode, it produces reflection energy. The magnitude of the reflection is small and the phase of reflection is either 0° or 180° out of phase, dependent on the substrate and electrode material. The SAW reflection from the front edge of a quarter wavelength electrode $A_R^1$ is assumed to be 0° and is in the opposite direction from the incident SAW (labelled $A_I$). As the SAW continues to propagate, it encounters the back edge of the electrode, which in this case is a quarter wavelength electrode. At this point energy is reflected ($A_R^2$) with a phase shift of 180°. At center frequency, the propagation delay of $A_R^2$ yields an additional 180° phase shift with respect to the front edge. This yields a total electrode reflection of $A_R = A_R^1 + A_R^2$.

There are multiple reflections within an electrode and many reflections within a quarter wavelength electrode array. These multiple reflections result in stored energy within the structure. The stored energy yields longer time domain impulse responses and distortion of the desired frequency response.

FIG. 3 shows the effect of the reflections on the SAW as it is received by a subsequent filter. In 3a, a SAW is shown which was generated by a uniform, non-reflecting transducer. The SAW of 3b results from a transducer having several sets of reflecting electrodes. The energy in FIG. 3b is momentarily stored within the transducer as seen by peak 8 of the SAW, and then the entire SAW degenerates. The results of the stored energy on the received SAW are shown in FIGS. 4a and 4b. FIG. 4a shows the main SAW time domain impulse response and major side lobe wherein a long tail response is evident. FIG. 4b shows the measured frequency response. The large ripple is due to the internal transducer reflections. Such responses are unallowable in most applications.

Referring now to FIG. 5, a unit cell 10 of a SAW transducer is shown according to the present invention.

This unit cell is the smallest cell for reflection cancellation, and is three wavelengths wide. Unit cell 10 comprises positive electrode 12 and negative electrodes 13 through 16. Electrodes 12 and 14 through 16 are one-quarter wavelength in width. Electrode 13 is one-half wavelength in width. One-quarter wavelength electrodes are used to reduce line resolution requirements. However, the present invention is insensitive to wavelength widths in the sense that groups of dummy electrodes of any particular wavelength width can be phase shifted.

In unit cell 10, SAW is generated by electrodes 12 and 13. This SAW will propagate in the direction of dummy electrodes 14 through 16. Electrode 12 will also generate a SAW in the opposite direction due to another electrode 17 (outside of unit cell 10). The energy reflections of the SAW propagating through electrodes 13 through 16 are mechanically eliminated by dummy electrodes 14 through 16 when electrode 16 is located one-half wavelength away from electrode 15. In other words, dummy electrodes 13 though 15 are equally spaced at one-quarter wavelength apart. Dummy electrode 16 is spaced one-half wavelength from dummy electrode 15, or twice the spacing of the other dummy electrodes.

FIG. 6 shows a transducer 30 incorporating several unit cells. As evidenced in FIG. 6, the electrode positive/negative sets may be grouped together, and the dummy electrodes may be grouped together. This grouping facilitates weighting of the electrodes for specific SAW characteristics. However, the dummy electrodes of the various unit cells must not be removed too far from the unit cells' electrode sets. The farther away from the electrode sets the dummy electrodes are, the less impact the dummy electrodes have on reflections which are off from center frequency. In other words, the farther from the source of the SAW generation that the reflection cancellation electrodes (dummy electrodes) are, the greater the amount of reflections remain to distort the SAW characteristics over a specified band width. However, there will be no reflections at center frequency no matter how far away the dummy electrode are from the source electrode sets.

FIGS. 7a and 7b shows the SAW impulse response and the frequency response for transducer 30. The SAW impulse response shows a proper side lobe response, while the frequency response shows allowable rippling and little edge reflection distortion. The results shown in FIGS. 7a and 7b were performed on transducer 30 without optimization. With optimization, the ripping in the frequency response of 7b would be virtually removed.

Thus there has been provided, in accordance with the present invention, a SAW reflectionless quarter wavelength transducer that fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. A surface acoustic wave (SAW) transducer comprising:
   a substrate;
   means for generating a SAW comprising a plurality of electrodes each having a first width of one-quarter wave lengths;
   the means for generating a SAW coupled to the substrate;
   a plurality of dummy electrodes each having a width equal to the first width;
   the plurality of dummy electrodes coupled to the substrate in the direction of the SAW propagation;
   at least one electrode having a second width of one-half wave lengths; and
   the at least one electrode having a second width coupled to the substrate in the direction of the SAW propagation.

2. A surface acoustic wave (SAW) transducer according to claim 1 wherein the second width is an integer multiple of one-half wave lengths.

3. A method for eliminating energy reflections caused by a propagating surface acoustic wave (SAW) generated within a SAW transducer as the SAW encounters transducer electrodes, the SAW having a direction of propagation through a SAW device substrate, the method comprising the steps of:
   coupling to the substrate along the direction of SAW propagation a plurality of dummy electrodes which are not actively generating SAWs, each of the plurality of dummy electrodes having a first width of one-quarter wave lengths;
   coupling to the substrate at least one electrode having a second width of one-half wave lengths;
   phase shifting within the at least one electrode energy reflections from the plurality of dummy electrodes equal to and opposite in phase with the energy reflections caused by the propagating SAW; and
   combining the phase shifted energy reflections with the energy reflections caused by the propagating SAW to cancel with the phase shifted energy reflections and the reflections caused by the propagating SAW.

4. A surface acoustic wave (SAW) transducer comprising:
   a substrate;
   a plurality of unit transducers coupled to the substrate, each of the unit transducers comprising;
   means for generating a SAW comprising a plurality of electrodes each having a first width of one-quarter wave lengths;
   the means for generating a SAW coupled to the substrate;
   a plurality of dummy electrodes each having a width equal to the first width;
   the plurality of dummy electrodes coupled to the substrate in the direction of the SAW propagation;
   at least one electrode having a second width of one-half wave lengths; and
   the at least one electrode having a second width coupled to the substrate in the direction of the SAW propagation.

5. A surface acoustic wave (SAW) transducer according to claim 4 wherein the second width is an integer multiple of one-half wave lengths.

* * * * *